June 4, 1968 D. FISHMAN ET AL 3,387,191

STRAIN RELIEVING TRANSITION MEMBER FOR CONTACTING SEMICONDUCTOR DEVICES

Filed March 19, 1965

Inventors
DENIS FISHMAN
LEONARD T. A. BECKETT
By [signature]
Attorney

United States Patent Office 3,387,191

Patented June 4, 1968

3,387,191

STRAIN RELIEVING TRANSITION MEMBER FOR CONTACTING SEMICONDUCTOR DEVICES

Denis Fishman and Leonard Thomas Alexander Beckett, Aldwych, London, England, assignors to International Standard Electric Corporation, New York, N.Y., a corporation of Delaware Filed Mar. 19, 1965, Ser. No. 441,119
Claims priority, application Great Britain, Apr. 24, 1964, 17,027/64
3 Claims. (Cl. 317—234)

ABSTRACT OF THE DISCLOSURE

A strain relieving transition plate for coupling a semiconductor electrode such as molybdenum having a relatively low thermal expansion coefficient to a terminal member such as copper having a relatively high thermal expansion coefficient. The transition member includes a low expansion coefficient disk (matching the expansion coefficient of the semiconductor electrode) having a plurality of rodlike members extending from one surface of the disk. The rodlike members have a relatively high expansion coefficient (matching that of the terminal lead). The outer extremities, i.e., the free ends of the rodlike members describe a convex arc which serves to provide additional strain relief.

This invention relates to semiconductor devices.

In connecting semiconductor elements into typical device structures, there has to be taken into account the brittle and weak nature of the semiconductor material and the low coefficient of expansion of typical semiconductor materials such as silicon and germanium.

It is therefore common practice to support the semiconductor element by means of a low expansion transition member such as molybdenum.

The transition member materials are not in general suitable for use in fabricating the main structure of the device because of cost, difficulty of working and relatively low electrical and thermal conductivity. Therefore, to provide an hermetic enclosure, means for passing current to the device, and means for removing heat generated during the operation of the device, other materials must be used.

Commonly the relevant components are made of copper or like metals having relatively high electrical conductivity. However, these materials also have a relatively high coefficient of thermal expansion.

In joining the low expansion transition members to the high expansion components and in subsequent thermal cycling during operation of the device, mechanical strains are introduced, leading to weakening of the joints. Such joints are known to fail when the device is thermally cycled between the extremes of temperature encountered in service, owing to fatigue of the joint material when soft solder is used as the jointing material, while hard-soldering (brazing) involves excessive temperatures which can be deleterious to both the device element and the material of its housing.

It is an object of the present invention to provide an assembly for a semiconductor device in which such strains are largely eliminated.

According to one aspect of the invention, there is provided a bimetallic matching element, a so-called "transition member" for enabling two components of differing coefficients of thermal expansion to be joined rigidly without appreciable mechanical strain arising owing to incidental temperature variations either during joining or subsequently, which comprises two rigidly joined electrically conducting materials having coefficients of thermal expansion respectively equal, or approximately so, to those of the two components to be joined, in which the said material of lower coefficient is in the form of a plate, while the other material is in the form of a layer rigidly attached to said plate and is provided with a strain-relieving shape.

According to another aspect of the invention, there is provided a semiconductor device which includes a semiconductor body and a metallic component part having a coefficient of thermal expansion markedly different from that of said body, and means for joining rigidly and conductively said semiconductor body and said component part without substantial risk of mechanical strain developing in such joint, body or part arising from incidental temperature variations, which means includes a transition member as described in the last preceding paragraph.

According to yet another aspect of the invention, there is provided a method of making a semiconductor device, which includes a semiconductor body and a metallic component part having a coefficient of thermal expansion different from that of said body and to which part said body is intended to be conductively joined, which method includes the step of bonding said body and said part to opposite faces of a transition member as described in the last-but-one preceding paragraph.

An embodiment of the invention will now be described with reference to the accompanying drawings, in which.

Figure 1:
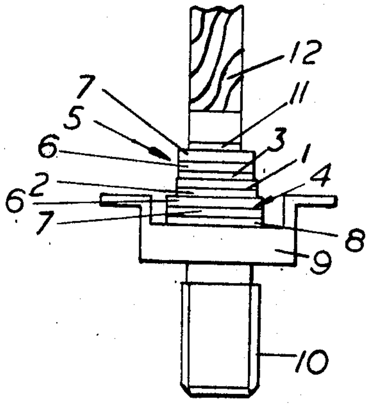
FIG. 1 is a side view of a semiconductor rectifier device.

Referring to FIG. 1, a semiconductor element 1 of silicon containing a PN junction is bonded by layers of soft solder 2 and 3 between composite transition members 4 and 5, each transition member consisting of a molybdenum disc 6 hard-soldered to a copper disc 7. The silicon element 1 is attached at its opposing faces to the molybdenum disc 6 of respective transition members 4 and 5. The copper disc 7 of transition member 4 is bonded by a layer of soft solder 8 to a copper base electrode 9 which also forms a heat sink and is provided with a threaded portion 10 for mounting purposes. The copper disc 7 of transition member 5 is bonded by a layer of soft solder 11 to a copper electrode 12 in the form of a multistrand leadout conductor which extends through a sealing cover (not shown) fastened to the base 9.

The coefficient of expansion of the molybdenum discs substantially matches the coefficient of expansion of the silicon element, while the coefficient of expansion of the copper discs obviously matches the coefficient of expansion of the electrodes.

Since the copper discs have a higher coefficient of expansion than the molybdenum discs, it will be seen that each of the transition members 4 and 5 will behave as a bimetallic element which by virtue of the dissimilar thermal expansion of the two metals will tend to bow on the application of heat produced during the soldering operations and subsequently due to thermal cycling of the device when in use.

Figure 2:
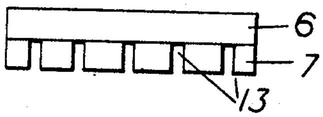
FIGS. 2 and 3 are side and underneath views respectively of one form of a component part of the rectifier, the co-called "transition member"
Figure 3:
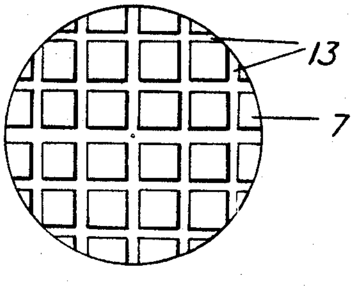

To counter this bimetallic distortion movement each transition member is constructed as shown in FIGS. 2 and 3, with the copper disc 7 deeply slotted in two directions at right angles. This results in a weakening of the copper and prevents it from applying any appreciable bending moment to the molybdenum disc 6.

The slots 13 preferably extend as far as the molybdenum disc 7, thus having the effect of dicing the copper disc. Although slots running in two directions, as described, are sufficient to achieve the desired strain-relieving effect, slots in more than two directions are equally effective.

The slotting of the copper disc 7 may be effected by a sawing or milling operation or by well-known photolithographic techniques, carried out on the composite member.

Figure 4:
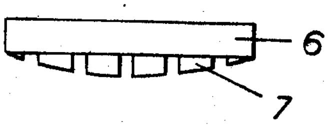
FIG. 4 is a side view of an alternative form of the component part.

Alternatively each transition member may be constructed as shown in FIG. 4, where the copper disc 7 has a domed section, the thinner copper at the edges again acting to relieve strain.

When such a composite disc is used for mounting a silicon element into a device structure, the face presented to the silicon may effectively be considered as molybdenum, and the face presented to the copper body member may be effectively considered as copper, without regard to the nature of the other face, in either case.

With such a transition member, the joints between silicon and molybdenum may be soft-soldered since there is no appreciable difference in thermal expansion to cause strain and fatigue, whereas a hard-soldered fatigue-resistant joint is provided between the materials of unlike expansion within the body of the transition member.

The pair of transition members and silicon form a "cell" which may be chemically etched without involving the rest of the device structure. No hard soldering needs to be done on the copper base, thus avoiding any softening thereof, or other deterioration of its properties by excessive heat.

A number of alternative methods of construction of both forms of transition member avoiding the hard-soldered joint between the two discs are, firstly, for the copper to be cast on to the molybdenum disc, or, secondly, for the copper disc to be produced and joined integrally to the molybdenum disc by a powder metallurgical process.

In the assembling of the rectifier of FIG. 1, it is possible to utilise a silicon element not at this stage containing a PN junction, i.e. an element of intrinsic silicon, and to introduce the required junction by an alloying process, in which case the bonding layers 2 and 3 may for example contain aluminium and gold-antimony respectively to provide the requisite doping of the element during assembly.

It is to be understood that while a semi-conductor element of silicon has been specifically mentioned in the above description, other semiconductor elements such as germanium and compound semiconductors such as gallium arsenide are equally applicable.

One or both of the electrodes may equally effectively be of silver, aluminium or other high conductivity and high expansion metals, with the disc attached thereto having a coefficient of expansion substantially matching the coefficient of expansion of the electrode and possibly of the same material as the electrode.

Instead of molybdenum, the discs attached to the semiconductor element may be of any other material having a coefficient of expansion substantially matching the coefficient of expansion of the semiconductor element, such as tungsten, sintered compacts of molybdenum or tungsten with copper or silver.

Furthermore, the molybdenum or the like discs may be plated with an adherent film of copper, chromium, nickel, silver or gold, sintered as necessary to secure adhesion. The copper discs may be plated with silver or gold to provide resistance to etching processes.

What we claim is:

1. A semiconductor device strain relief transition member for connecting a first surface having a relatively low coefficient of thermal expansion to a second substantially parallel surface having a relatively high coefficient of thermal expansion, comprising:

a disk having one major surface adapted to be bonded to said first surface, said disk having a coefficient of thermal expansion substantially equal to that of said first surface;

a plurality of rodlike members extending from and substantially normal to the other major surface of said disk, each said rodlike member having a coefficient of thermal expansion substantially equal to that of said second surface, the free outer extremities of said rodlike members describing an arcuate profile convex to said other major surface such that the length of the rodlike members adjacent the periphery of said disk is substantially less than the length of the rodlike members relatively remote from said periphery, each said outer extremity being adapted to be bonded to said second surface.

2. A transition member according to claim 1, further comprising a thin layer bonded to said other major surface and contiguous with the inner extremities of said rodlike members, said layer having a coefficient of thermal expansion substantially equal to that of said second surface.

3. A transition member according to claim 2, wherein said first surface comprises molybdenum and said second surface comprises copper.

References Cited

UNITED STATES PATENTS

| | | | |
|---|---|---|---|
| 2,933,662 | 4/1960 | Boyer et al. | 317—234 |
| 3,012,305 | 12/1961 | Ginsbach | 29—25.3 |
| 3,051,878 | 8/1962 | Finn et al. | 317—240 |
| 3,097,329 | 7/1963 | Siemens | 317—234 |
| 3,128,419 | 4/1964 | Waldkotter et al. | 317—234 |
| 3,209,218 | 9/1965 | Zielasek et al. | 317—240 |
| 3,228,104 | 1/1966 | Emeis | 29—482 |
| 3,273,029 | 9/1966 | Ross | 317—234 |

JOHN W. HUCKERT, *Primary Examiner.*

R. F. SANDLER, *Assistant Examiner.*